United States Patent [19]

Kaller et al.

[11] Patent Number: 5,070,332
[45] Date of Patent: Dec. 3, 1991

[54] TWO-STEP SUBRANGING ANALOG TO DIGITAL CONVERTER

[75] Inventors: Roy S. Kaller; David M. Thomas, both of Tucson, Ariz.

[73] Assignee: Burr-Brown Corporation, Tucson, Ariz.

[21] Appl. No.: 671,219

[22] Filed: Mar. 18, 1991

[51] Int. Cl.⁵ .............................................. H03M 1/14
[52] U.S. Cl. .................................... 341/156; 341/136
[58] Field of Search ........................ 341/136, 156, 159

[56] References Cited

U.S. PATENT DOCUMENTS

| | | | |
|---|---|---|---|
| 4,612,531 | 9/1986 | Dingwall et al. | 340/347 |
| 4,639,715 | 1/1987 | Doluca | 341/159 |
| 4,734,677 | 3/1988 | Cake et al. | 341/156 |
| 4,763,107 | 8/1988 | Koen et al. | 341/156 |
| 4,792,787 | 12/1988 | Speiser et al. | 341/156 |
| 4,804,960 | 2/1989 | Fernandes et al. | 341/158 |
| 4,814,767 | 3/1989 | Fernandes et al. | 341/158 |
| 4,816,831 | 3/1989 | Mizoguchi et al. | 341/156 |
| 4,839,653 | 6/1989 | Devito | 341/157 |
| 4,862,171 | 8/1989 | Evans | 341/156 |
| 4,875,048 | 10/1989 | Shimizu et al. | 341/156 |
| 4,973,976 | 11/1990 | Lee et al. | 341/141 |
| 4,999,624 | 3/1991 | Pichlik | 341/118 |

Primary Examiner—J. R. Scott
Assistant Examiner—Marc S. Hoff

Attorney, Agent, or Firm—Antonio R. Durando; Harry M. Weiss

[57] ABSTRACT

A subranging analog-to-digital converter (ADC) that comprises a biasing architecture including a single string of transistor current sources used to generate the reference digital-to-analog converter (DAC) bit currents, the low-resolution flash ADC reference ladder voltage, and the ADC bipolar offset voltage. The reference DAC resistors, low resolution voltage reference ladder resistors, error amplifier gain set resistors, and the bipolar offset resistors are all constructed from the same material and using the same physical construction, so that they match with high precision and track over process and temperature. In one embodiment, the low-resolution flash ADC is itself implemented as a two-step parallel subranging ADC, comprising a most-significant-bit reference ladder and a least-significant-bit reference ladder, and includes an internal flash DAC whose bit currents are also provided by the same single string of transistor current sources. In addition, a shunt resistor across the least-significant-bit reference ladder of the low-resolution flash ADC makes it possible to tie it in series directly to its most-significant-bit reference ladder using the same resistor material, thus providing inherent tracking of the reference voltages of the two ladders. Finally, a bias current compensation resistor network is provided on the input side of the flash-ADC comparators to cancel input bias current errors.

19 Claims, 5 Drawing Sheets

TWO-STEP SUBRANGING ANALOG TO DIGITAL CONVERTER

BACKGROUND OF THE INVENTION

1. Field of the Invention

This invention pertains to the general field of analog to digital converters. In particular, it provides a new and improved two-step subranging analog to digital converter characterized by a gain matching architecture for all of its constituent elements.

2. Description of the Prior Art

The function of an analog to digital converter (ADC) is to accurately convert an analog input signal, sampled from a varying analog voltage source and held constant for a specified interval of time by sample-and-hold circuitry, into a digital output represented by a coded array of binary bit signals. The output bit information is generated by processing the analog input signal through a number of comparator steps. An n-bit digital output can be produced in one step with $2^n - 1$ parallel comparators (flash ADC's) or, at the limit, by n sequential steps with a single comparator (successive approximation ADC's). The one step approach obviously provides higher speed of conversion, but is limited by higher input capacitance, power consumption and device yield constraints associated with the high number of comparators in the circuitry.

Thus, in order to partially exploit the benefits of both approaches, designers have developed architectures using one or more low resolution ADC's and a digital to analog converter (DAC) with feedback to build a higher resolution ADC (subranging ADC's). A two-step subranging feedback ADC is one of the most commonly used forms of subranging ADC's and is illustrated in block diagram form in FIG. 1. During the first step, an analog input voltage signal at node 110 from the output of a sample-and-hold amplifier (not shown) is fed into an m-bit low-resolution flash ADC 130 through a switch 128 in a subtractor and error amplifier network 120. The low-resolution flash ADC converts the analog signal into the upper significant m bits of its digital value, which are stored in a logic network 140 and then fed into an m-bit resolution reference DAC 150. The reference DAC reconverts the first step m-bit digital value into an analog value, which is fed back to a subtracting circuit 124 for comparison with the analog input to produce an analog error voltage value. This error voltage is amplified through a differential amplifier 126 and, in the second step of the two-step subranging feedback ADC, fed through the low-resolution flash ADC 130 again to produce the lower significant m bits of the input's digital value. The second step output is then combined with the first step's in the logic network 140 to produce a high resolution digital output 115. The sequencing of the various steps is timed and controlled by appropriate logic circuitry 160.

Theoretically, the use of such a two-step subranging approach makes it possible to produce a digital output with 2m-bit resolution with a single m-bit flash DAC, thus reducing the number of comparators required from $2^{2m} - 1$ to $2^m - 1$. In practice, though, other factors that affect the performance of the two-step subranging converter may reduce its accuracy to unacceptable levels unless specific requirements are met for each of its individual elements. In particular, the reference DAC must have a resolution equal to the low-resolution flash ADC and an accuracy at least equal to the requirements for the overall two-step high-resolution converter. Moreover, the accuracy of the error amplifier must be equal to that of the low-resolution flash ADC. Finally, the gains of the reference DAC, the error amplifier, and the low-resolution flash ADC must track with an accuracy at least as great as that of the low-resolution flash ADC. While proper design and selection of components have been used to meet the resolution and accuracy specifications, these gain matching requirements have continued to be an obstacle to the optimal utilization of two-step subranging analog-to-digital conversion.

Various types of subranging ADC's are described in several U.S. Pat., such as No. 4,612,531 to Dingwall et al. (1986); U.S. Pat. No. 4,804,960 and U.S. Pat. No. 4,814,767 to Fernandes et al. (1989); and U.S. Pat. No. 4,816,831 to Mizoguchi et al. (1989). In particular, in U.S. Pat. No. 4,875,048 (1989), Shimizu et al. disclose a two-step parallel ADC with gain matching requirements typical of subranging ADC's. They provide a gain correction circuit that automatically establishes a gain for the reference DAC on the basis of a reference voltage applied to a first low-resolution flash ADC used to generate the upper significant bits of the digital output. In addition, a separate reference-voltage generating circuit is provided to establish the upper and lower reference voltages, on the basis of the step voltage of the reference DAC, of a second low-resolution flash ADC used to generate the lower significant bits of the digital output. The circuitry described involves the use of control amplifier loops to force the various gains to track.

The prior art does not disclose a subranging ADC where the gain matching of the various components is obtained by a special architecture of the ADC itself, without the use of additional circuitry dedicated to that purpose. In fact, most of the prior art implemented into commercial products consists of 10-bit resolution subranging ADC's that either accept the nonlinearity resulting from lack of gain tracking or correct it by means of additional control circuitry. Thus, there still exists a need for a multi-step subranging ADC architecture that by itself provides the required gain tracking characteristics with a minimum number of components and low complexity for high speed, good accuracy, low power consumption, and low cost implementation.

BRIEF SUMMARY OF THE INVENTION

It is therefore an objective of this invention to provide an architecture for a subranging analog-to-digital converter that produces gain tracking between all of its subranging ADC elements without the use of additional circuitry dedicated to that purpose.

Another objective of the invention is that it be suitable for implementation with a low-resolution flash ADC step consisting of a two-step parallel subranging ADC, so that the total number of comparators can be materially reduced.

A further objective of this invention is that the analog-to-digital converter apparatus be suitable for implementation on a semiconductor substrate without additional processing.

Another goal of the invention is the ability to apply the same general concept in a variety of designs and physical embodiments to fit the various implementation processes currently known in the art. To that end, the apparatus described herein can be implemented in alternative circuitry obvious to one skilled in the art by the use of bipolar transistors or other equivalent devices, such as junction field-effect transistors, metal-oxide-semiconductor field-effect transistors, or any of the devices generally referred to in the industry as MOS.

Yet another objective of this invention is the realization of the above mentioned goals in an economical and commercially viable manner. This is done by utilizing simple components and methods of manufacture that are either already available in the open market or can be developed at competitive prices.

In accordance with these and other objectives, the subranging ADC of this invention comprises a biasing architecture that consists of a single string of transistor current sources used to generate the reference DAC bit currents, the low resolution flash ADC reference ladder voltage, and the ADC bipolar offset voltage. The reference DAC resistors, the low resolution voltage reference ladder resistors, the error amplifier gain set resistors, and the bipolar offset resistors are all constructed from the same material and using the same physical construction, so that they match with high precision and track over process and temperature. In one embodiment, the low-resolution flash ADC is itself implemented as a two-step parallel subranging ADC, comprising a most significant bit reference ladder and a least significant bit reference ladder, and includes an internal DAC whose bit currents are also provided by the same single string of transistor current sources. In addition, a shunt resistor (made of the same resistor material) incorporated across the least significant bit ladder of the low-resolution DAC makes it possible to tie it in series directly to its most significant bit reference ladder, thus providing inherent tracking of the reference voltages of the two ladders. Finally, a bias current compensation resistor network is provided on the input side of the low-resolution ADC comparators to cancel input bias current errors.

Various other purposes and advantages of the invention will become clear from its description in the specifications that follow, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DETAILED DESCRIPTION OF THE INVENTION

The heart of this invention lies in the novel approach adopted to control the gains of the various components of a subranging ADC in order to cause them to track. Instead of forcing each gain to match the voltage variations in the reference ladder through voltage control networks, this invention uses a single string of current sources to drive all components of the ADC, so that all voltage variations in the circuit, and corresponding gain changes, are automatically reflected uniformly throughout the entire circuit.

Figure 1:
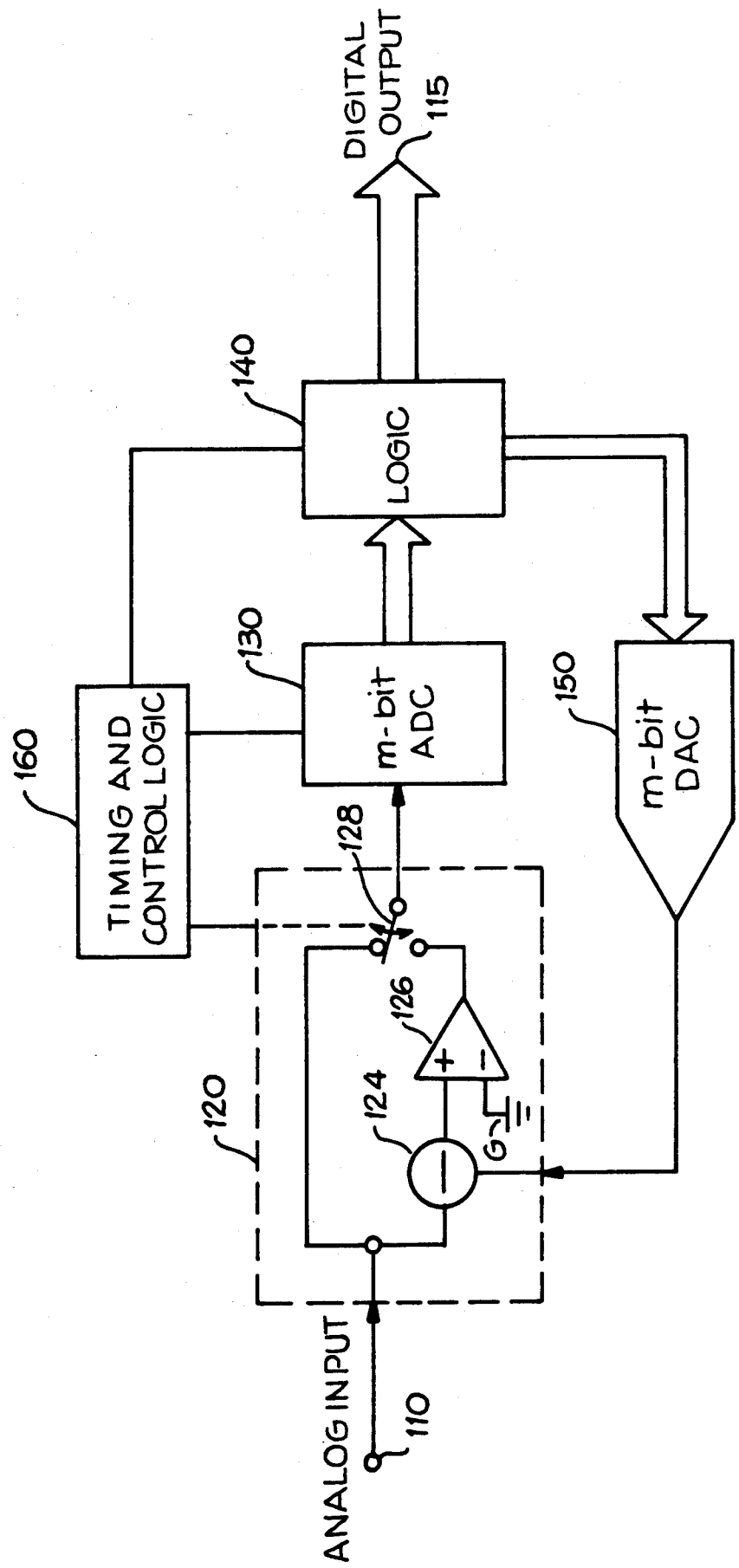
FIG. 1 is a block diagram showing a typical configuration of a conventional subranging ADC using one low-resolution ADC to build a higher resolution ADC.
Figure 2:
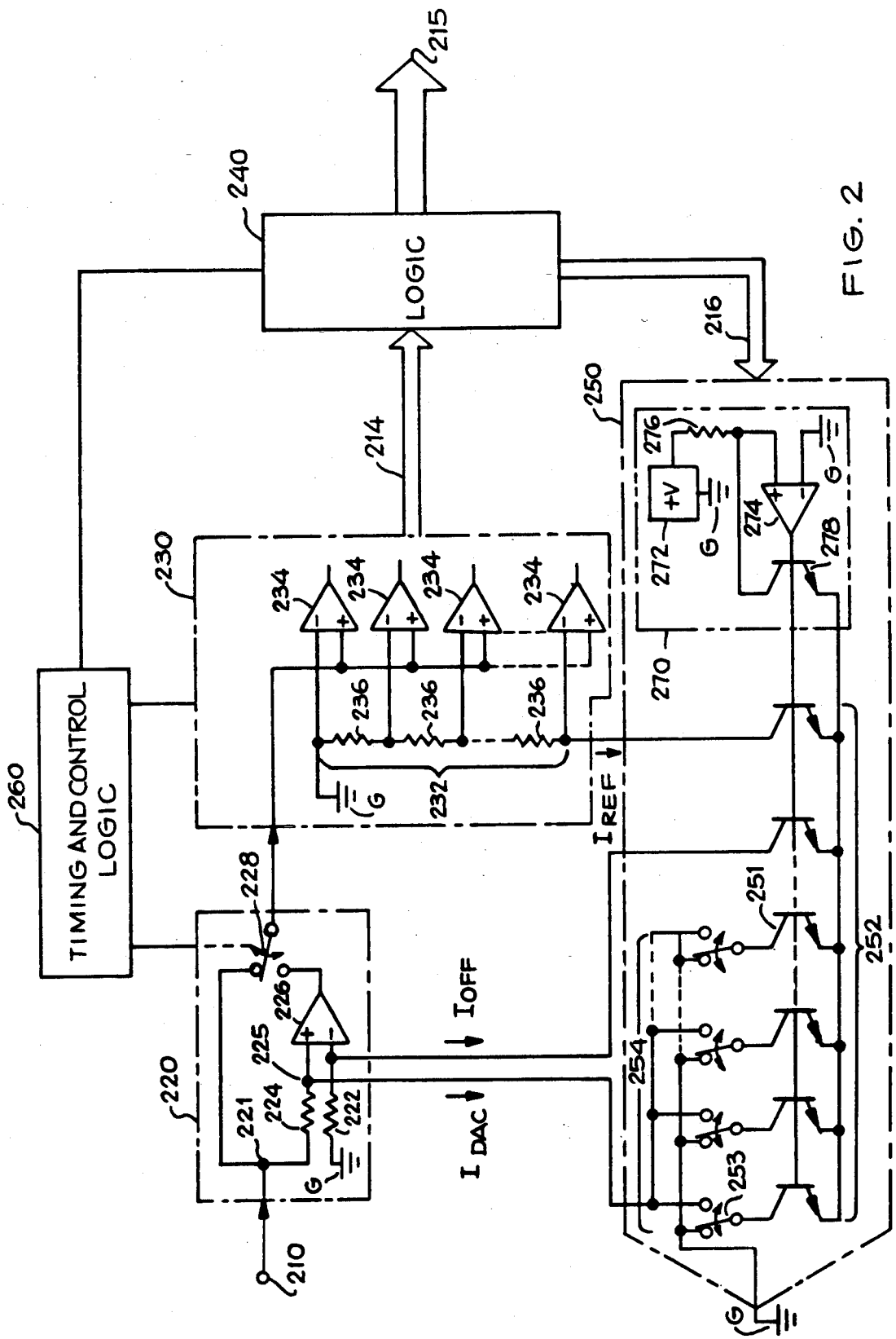
FIG. 2 is a schematic diagram showing a subranging ADC architecture according to the present invention wherein a single string of transistor current sources is used to generate the reference DAC bit currents, the low-resolution flash ADC reference ladder voltage, and the ADC bipolar offset voltage.

Referring to the drawings, all parts are designated by three-digit numerals and the same last two digits are used throughout to designate like parts in the various embodiments shown. FIG. 2 illustrates the basic architecture of the invention, wherein the conventional schematic of FIG. 1 is implemented by using a single string 252 of transistor current sources to generate the bit currents for the current-output reference DAC 250, the current for the reference voltage ladder 232 of the low-resolution flash ADC 230, and the bipolar offset current for the system. The subranging ADC of FIG. 2 includes an input node 210 where an analog voltage signal from a sample-and-hold amplifier is applied. The input node 210 is connected through node 221 to a network 220 that includes two alternative signal paths regulated by a switch 228 that is controlled by a conventional timing and control network represented by block 260. The first path is a direct connection between node 221 and a first position of the switch 228 (alternatively, it could include a unity-gain buffer for signal conditioning); the second path between node 221 and a second position of the switch 228 includes a subtraction resistor 224 in series with the noninverting input of a differential amplifier 226, whose inverting input is connected to ground G through a bipolar offset resistor 222. The output of switch 228 is connected to the noninverting input nodes of the string of comparators 234 in the low-resolution flash ADC 230. The inverting input nodes of this string of comparators is connected in standard fashion to a reference voltage ladder 232, which includes a series of resistors 236 of equal value and identical physical characteristics. The ladder 232 is connected between a ground G and a transistor current source in the current-output reference DAC 250. The number of comparators 234 and of corresponding resistors 236 in the low-resolution flash ADC is a function of the resolution desired, according to the $2^m - 1$ exponential relationship described above. Thus, for instance, 127 comparators are required for 7-bit resolution (m=7; $2^7 - 1 = 127$).

The low-resolution flash ADC 230 is coupled to the timing and control network 260 and feeds its digital output to a conventional logic network 240 through a one-way bus 214. This logic network, in turn, provides an overall ADC output through the one-way bus 215 and a feedback output through the one-way bus 216 that feeds the low-resolution flash ADC's output to the current output reference DAC 250. This DAC consists of a conventional string 254 of switches 253 that provide binarily weighted currents for digital-to-analog conversion of the digital signal received from the logic network 240. The output from the reference DAC is connected to node 225 between the subtraction resistor 224 and the differential amplifier 226 in the second path of network 220. All currents for the ADC, including the bipolar offset current $I_{OFF}$ for the differential amplifier 226, are derived from the single string 252 of n-p-n type bipolar transistors 251, whose base nodes are all connected to and driven by the same servo-circuit 270, thus ensuring proportional current flow through each transistor. In the embodiment shown in the figures, the servo-circuit 270 includes a voltage reference 272, an operational amplifier 274, a current scaling resistor 276 and a set-up transistor 278. Using a technique well understood in the art, by connecting the collector of the set-up transistor 278 to the noninverting input of amplifier 274, the current through the transistor is set to equal the ratio of the reference voltage to the scaling resistor.

In operation, during the first pass of the two-step conversion, the analog voltage input signal received at node 210 is transmitted to the noninverting input node of each comparator 234 in the low-resolution flash ADC 230 through the switch 228, which is appropriately set by the timing and control network 260. At the same time, the reference voltages at the inverting node of each comparator are established by the constant reference ladder current $I_{REF}$ drawn from one of the transistors 251 in the string of current sources 252 and flowing through the reference ladder 232 of equal resistors 236. The digital signals produced by the string of comparators during this first-pass flash conversion are latched and encoded according to conventional apparatus (not shown in the figures) and the resulting coded output constitutes the upper significant bits of the overall high resolution output, which is processed and retained by the logic network 240. This low-resolution digital output is then fed to the reference DAC 250 where it is reconverted to an analog signal by summing the currents from current sources 251 in the string 252 according to the state of the switches 253. The total current through all of these switches, $I_{DAC}$, flows from node 225 and through the subtraction resistor 224, thus producing a voltage drop at node 225 corresponding to the analog value of the most significant bits obtained from the first pass through the low-resolution flash DAC. The net result is that the voltage at node 225 represents the analog difference between the input voltage held at node 210 and the output from the reference DAC 250. The bipolar offset reference current $I_{OFF}$ from the differential amplifier 226 and $I_{REF}$ are similarly generated by transistors 251 in the string 252. This difference, or error, measured at node 225 is amplified by the differential amplifier 226 and fed again for a second pass to the low-resolution flash ADC 230 through switch 228, which at this time is set by the timing and control network 260 to receive the amplifier's output. Note that amplification of the error produced at node 225 is not necessary to practice this invention, so long as appropriate adjustments are made to the reference voltages in the low-resolution flash ADC. During the second pass of operation, the error signal is applied to the low-resolution flash ADC 230 and converted into a digital output that corresponds to the lower significant bits of the overall high resolution output of the apparatus. This digital signal is fed to the logic network 240 where it is combined with the upper significant bits from the first pass to generate a high resolution output produced at the one-way bus 215. Thus, a 2n-bit resolution digital output can be generated with this subranging ADC architecture by using one n-bit resolution flash ADC in combination with an n-bit reference DAC. As those skilled in the art would easily recognize from the schematic diagram of FIG. 2, any change in temperature or other condition that would change the currents through the string 252 of current source transistors 251 would necessarily affect uniformly the reference ladder current $I_{REF}$, the reference DAC current $I_{DAC}$, and the bipolar offset current $I_{OFF}$ (note that these currents may all be designated as reference currents because they determine corresponding reference voltages). Therefore, the corresponding voltage fluctuations automatically track and produce continuous gain matching between the elements of the overall ADC. This novel design feature produces an inherent gain matching among all components without any additional voltage control circuitry.

Figure 3:
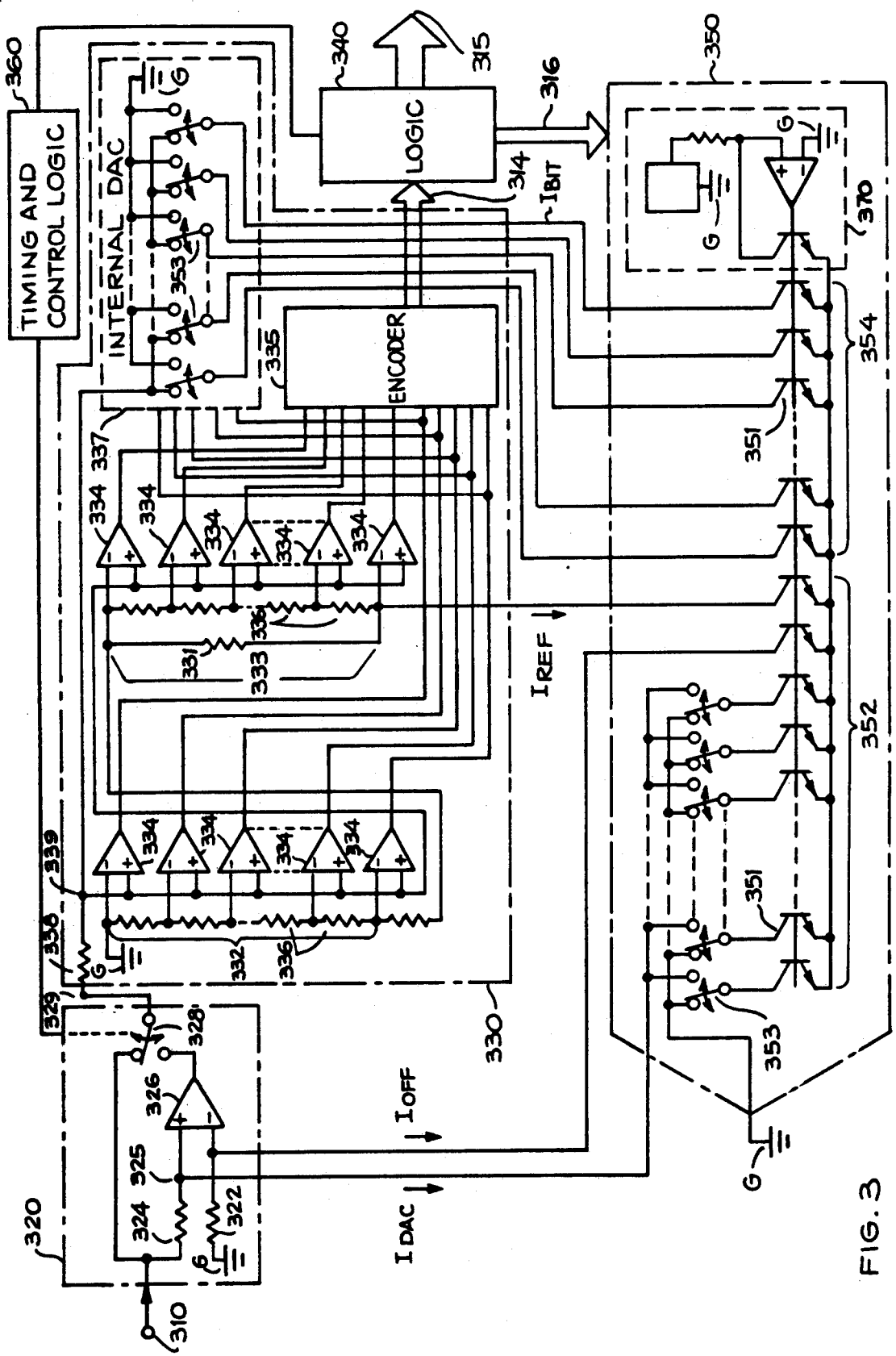
FIG. 3 shows a schematic diagram of an embodiment of the ADC apparatus of FIG. 2 wherein the low-resolution flash ADC is itself implemented as a two-step parallel subranging ADC and includes an internal DAC whose bit currents are also provided by the same single string of transistor current sources.

As described above and apparent from the schematic of FIG. 2, all resistors 236 in the reference ladder 232 are equal in value and are made of the same material, which is particularly suitable for monolithic construction. Since the reference ladder 232 is composed of $2^m - 1$ resistors for an m-bit resolution in the low-resolution flash ADC, the number of resistors (and corresponding comparators) required tends to be large. For example, a 6-bit resolution flash ADC requires 63 resistors. In addition, this number is commonly increased by the requirements for additive digital error correction, which requires some degree of redundancy in the level of resolution of the low-resolution flash ADC. For instance, two 7-bit conversions are typically first generated and then combined to produce a 13- or 12-bit level of resolution. As a result of this large number of resistors required for flash conversion, the incremental voltage available for each reference-ladder step, within the constraints of the positive and negative voltage rails normally used in this type of apparatus, becomes unacceptably small for high resolution flash. In addition, the correspondingly large number of comparators results in high power consumption, high manufacturing cost, and low yield. In order to overcome these problems, a second embodiment of this invention, shown in FIG. 3, illustrates a two-step subranging ADC where the low-resolution flash itself involves a two-step parallel subranging design with the biasing architecture described above. In addition, a shunt resistor is provided that permits the utilization of the same resistor material for both reference ladders corresponding to the most significant bits and least significant bits of the low-resolution conversion. Referring to FIG. 3, the low-resolution flash ADC 330 comprises a most-significant-bit portion, corresponding to segment 332 of the voltage reference ladder, and a least-significant-bit portion, corresponding to segment 333 in the ladder. Both segments consist of the same conventional design described in FIG. 2 and include a string of comparators 334 connected to the reference ladder and to the signal source in the network 320, which is equivalent to the network 220 described above. In addition, a low-resolution ADC subtraction resistor 338, constructed with the same material used for resistors 336 in the reference ladder, is provided between the output of the network 320 at node 329 and the input to the comparator string at node 339. The output of the comparators used for the most-significant-bit flash conversion is connected to a flash encoder 335 and to an internal DAC 337, that consists of the same conventional switch circuitry used in the current-output reference DAC 350. Each bit current $I_{BIT}$ in the flash DAC 337 is provided by the same biasing architecture used for the entire device, as illustrated by the string 354 of transistor current sources 351, which is driven by the same servo-circuit apparatus 370 controlling all current sources for the device. The least-significant-bit portion of the low-resolution flash ADC 330, corresponding to segment 333 of the voltage reference ladder, is constructed with a shunt resistor 331 in order to produce an equivalent resistance for the segment 333 equal to that of each step in the most-significant-bit segment 332. Therefore, the value of resistor 331 is set, in a manner obvious to those skilled in the art, by the number of steps in the reference ladder of the least-significant-bit portion of the flash ADC. Resistor 331 is again constructed with the same material used for the subtraction resistor 338 and for all resistors 334. A single reference current $I_{REF}$ flows through the entire ladder and is generated by the same string 352 of transistor current sources 351 used in the first embodiment of the invention. Thus, a single string (352 plus 354) of transistor current sources 351 is used to generate the bit currents for the internal DAC 337, the bit currents for the reference DAC 350, the voltage for the reference ladder (332 plus 333) of the low-resolution flash ADC 330, and the bipolar offset current for the system.

In operation, the apparatus of FIG. 3 functions in the same manner as that of FIG. 2, with the additional feature that each subranging pass consists of an internal two-step parallel subranging procedure. The analog input voltage at node 310 is applied to node 329 through a switch 328, which is appropriately set by the timing and control network 360, and then to node 339 through the subtraction resistor 338. This signal is fed to the noninverting input node of each comparator 334 in the low-resolution flash ADC 330. At the same time, the reference voltages at the inverting node of each comparator are established by the constant current $I_{REF}$ drawn from one of the current sources in the string 352 and flowing through the reference ladder consisting of segments 332 and 333. During the first internal step of the first pass through the low-resolution flash ADC, digital signals corresponding to the most significant bits are produced by the string of comparators connected to the segment 332 of the reference ladder and are latched and encoded in the network 335. At the same time, this digital output is fed to the internal DAC 337 for reconversion to an analog signal which is subtracted from the input signal at node 329, thus automatically generating at node 339 an internal analog residue signal, or error, applied to the string of comparators connected to the segment 333 of the reference ladder where it is subjected to an internal second-step flash conversion. The second-step digital output, corresponding to the least significant bits of the first pass, is combined in the network 335 with the most significant bits produced during the first step and fed through a one way bus 314 to the logic network 340. As in the embodiment described in FIG. 2, this first pass digital output, which constitutes the upper significant bits of the overall high resolution output, is retained in the system's logic and fed back through the one way bus 316 to the reference DAC 350, where it is reconverted to an analog signal by a series of currents through switches 353. The total current through these switches, $I_{DAC}$, flows from node 325 and through a subtraction resistor 324, thus producing a voltage drop at node 325 corresponding to the analog value of the first-pass's most significant bits. The net result is again that the voltage at node 325 represents the analog difference between the input voltage held at node 310 and the output from the reference DAC 350.

As in the first embodiment of FIG. 2, the bipolar offset current $I_{OFF}$ and the reference ladder current $I_{REF}$ are similarly generated by transistors in the string 352 of transistors 351.

The error produced at node 325 is either amplified by the differential amplifier 326, which is grounded through the bipolar offset resistor 322 at its inverting node, or is directly fed again to the low-resolution flash ADC 330 through switch 328, which at this time is set to connect with the amplifier's output by the timing and control network 360. During this second pass through the low-resolution flash ADC, the error signal is first converted through the most-significant-bit segment 332 and then through the least-significant-bit segment 333 as detailed with respect to the first pass. The resulting output from the flash encoder 335, which constitutes the lower significant bits of the overall high resolution output of the apparatus, is fed to the logic network 340 where it is combined with the upper significant bits from the first pass to generate a high resolution output produced at the one-way bus 315. Again, because of the special architecture used to generate all the currents in the apparatus, any change in temperature or other condition that would affect the currents through the strings 352 and 354 of current source transistors 351 would necessarily affect equally the reference ladder current $I_{REF}$, the internal flash DAC currents $I_{BIT}$, the reference DAC current $I_{DAC}$, and the bipolar offset current $I_{OFF}$ (all referred to as reference currents). Therefore, the corresponding voltage fluctuations automatically track and produce continuous gain matching among the elements of the overall ADC.

Figure 4:
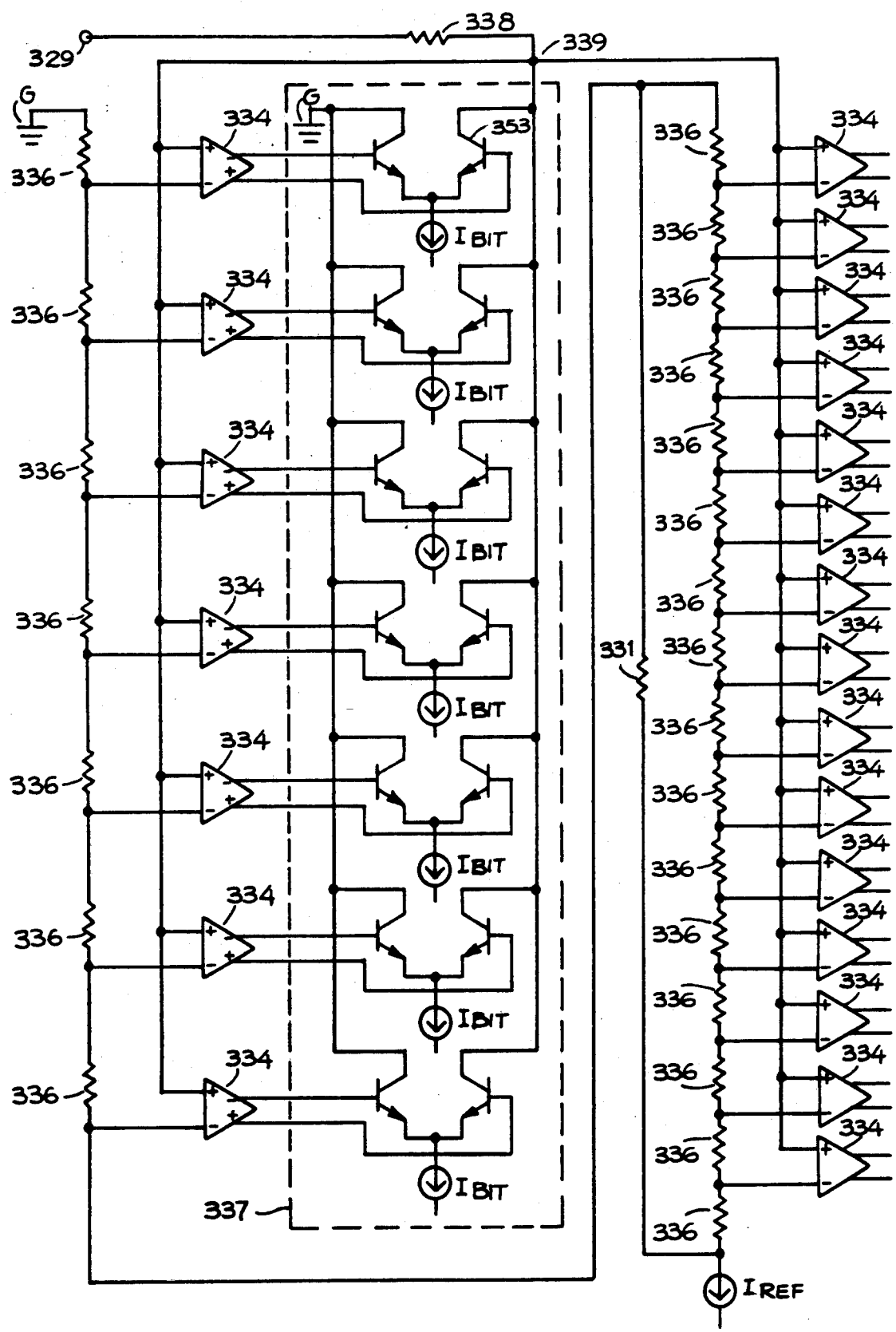
FIG. 4 shows a more detailed schematic diagram of the ADC and DAC portions of the low-resolution flash ADC of FIG. 3.

Thus, as in the case of the first embodiment shown in FIG. 2, a 2n-bit resolution digital output can be generated with this subranging ADC architecture by using a single n-bit resolution flash ADC. Instead of requiring $2^n-1$ comparators and reference voltage elements, though, the same level of high resolution can be achieved with substantially fewer elements as a result of the two-step implementation of the low-resolution flash ADC illustrated in FIG. 3. Assuming, for example, that a 12-bit subranging ADC is desired and that some resolution redundancy is required for error correction, it could be implemented with 127 comparators, according to the embodiment of FIG. 2, or with 22, according to the two-step low-resolution flash apparatus of FIG. 3. In the latter case, as shown in detail in FIG. 4, a 7-bit low-resolution flash ADC is constructed with a 3-bit most-significant-bit portion and a 4-bit least-significant-bit portion, which consist of 7 ($2^3-1$) and 15 ($2^4-1$) reference voltage steps, respectively, for a total of 22. FIG. 4 also illustrates one way to implement the switch circuitry of the internal DAC 337.

Figure 5:
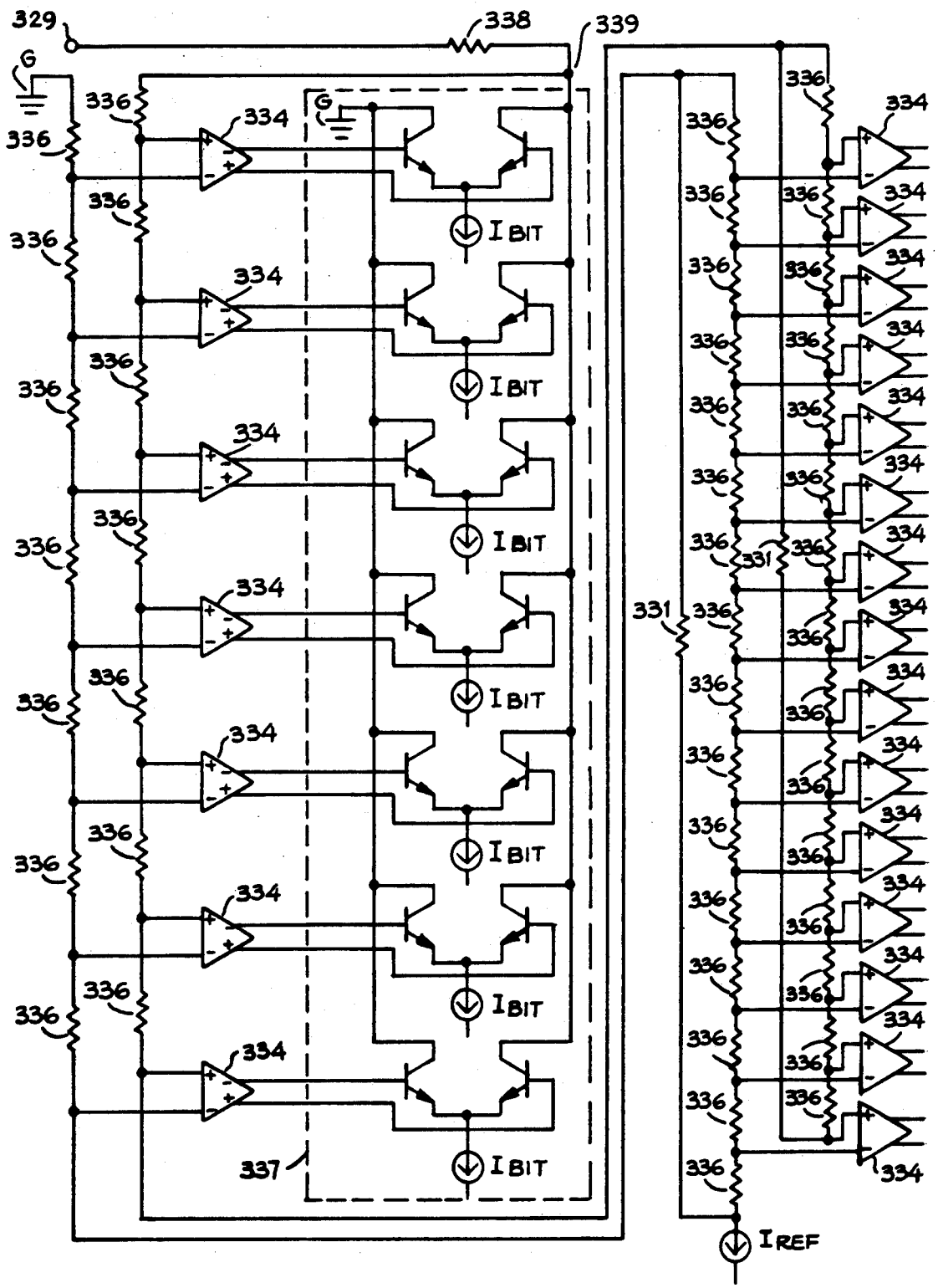
FIG. 5 shows the schematic diagram of FIG. 4 wherein a bias current compensation resistor network is provided on the input side of the ADC comparators.

FIG. 5 shows an input bias current compensation resistor network that constitutes an additional refinement to the architecture shown in FIG. 4. In fact, the difference in impedance between the inverting and noninverting inputs of each comparator 334 produces a bias current error that increases with the number of comparators in the device. In order to compensate for this imbalance, a resistor network identical to that in the voltage reference resistor ladder is provided, so that the impedance at both inputs of each comparator is exactly the same and input bias current errors are cancelled. Of course, by using the same material for both sets of resistors, error cancellation is maintained with temperature and other changes.

It is understood that many equivalent detailed circuit designs are possible within the scope of the present invention, with corresponding modifications to handle the current levels and parameter match requirements for proper functioning of the circuit. The architecture of the electronic circuitry described herein is suitable for monolithic fabrication and can be assembled in its entirety using currently available components. On the other hand, those skilled in the art could easily design circuits to practice the invention with alternative components, such as field-effect transistors and metal-oxide-semiconductor field-effect transistors, or any equivalent devices, such as transistors generally referred to as MOS in the industry.

Thus, various changes in the details, steps and materials that have been described may be made by those skilled in the art within the principles and scope of the invention herein illustrated and defined in the appended claims. While the present invention has been shown and described herein in what is believed to be the most practical and preferred embodiment, it is recognized that departures can be made therefrom within the scope of the invention, which is therefore not to be limited to the details disclosed herein, but is to be accorded the full scope of the claims so as to embrace any and all equivalent apparatus and methods.

We claim:

1. A subranging high-resolution analog-to-digital converter, comprising:
   (a) a low-resolution flash analog-to-digital converter for subjecting first an analog input signal and second an analog error signal to conversion into corresponding first and second low-resolution digital signals, said low-resolution analog-to-digital converter comprising a reference voltage ladder consisting of a string of series resistors;
   (b) a current-output reference digital-to-analog converter of resolution equal to that of said low-resolution analog-to-digital converter for reconverting said first low-resolution digital signal into a corresponding analog feedback signal;
   (c) error measurement means for measuring the difference between said analog feedback signal and said analog input signal to determine said analog error signal;
   (d) logic means for combining said first and second low-resolution digital signals into a high-resolution digital signal; and
   (e) timing and control means for sequentially enabling production of said first low-resolution digital signal, said analog feedback signal, said analog error signal, said second low-resolution digital signal, and said high-resolution digital signal;
   wherein a single string of current sources controlled by the same servo circuit is used to generate at least two reference currents.

2. The analog-to-digital converter defined in claim 1, wherein the subtraction resistor in said error measurement means, the resistors in said low-resolution voltage reference ladder, the current scaling resistor in said servo circuit, and the bipolar offset resistor are all constructed of the same material.

3. The analog-to-digital converter defined in claim 2, wherein all the resistors in said reference voltage ladder have substantially equal value.

4. The analog-to-digital converter defined in claim 3, wherein said single string of current sources consists of bipolar transistor junctions driven by the same servo-circuit.

5. The analog-to-digital converter defined in claim 1, wherein said low-resolution flash analog-to-digital converter consists of a two-step parallel subranging analog-to-digital converter comprising:
   (f) a most-significant-bit flash analog-to-digital converter for producing a digital signal corresponding to the most significant bits of, first, said analog input signal and, second, said analog error signal, said most-significant-bit flash analog-to-digital converter comprising a most-significant-bit reference voltage ladder consisting of resistors connected in series;
   (g) an internal digital-to-analog converter of resolution equal to that of said most-significant-bit flash analog-to-digital converter for reconverting the digital output therefrom into a corresponding analog feedback signal;
   (h) a subtraction resistor in said low-resolution flash analog-to-digital converter for measuring the analog difference between the input to said most-significant-bit flash analog-to-digital converter and the analog feedback signal produced by said internal digital-to-analog converter;
   (i) a least-significant-bit flash analog-to-digital converter for producing a digital signal corresponding to the least significant bits of, first, said analog input signal and, second, said analog error signal, said least-significant-bit flash analog-to-digital converter comprising a least-significant-bit reference voltage ladder connected in series with said most-significant-bit reference voltage ladder and consisting of a shunt resistor connected in parallel with a string of series resistors; and
   (j) logic means for combining said digital signals corresponding to the most significant bits and the least significant bits of, first, said analog input signal and, second, said analog error signal to produce the output of said low-resolution flash analog-to-digital converter;
   wherein said single string of current sources is also used to generate the bit currents for said internal digital-to-analog converter.

6. The analog-to-digital converter defined in claim 5, wherein the subtraction resistors in said error measurement means and in said low-resolution flash analog-to-digital converter, the resistors in said reference digital-to-analog converter, the resistors in said most-significant-bit reference voltage ladder, the resistors in said least-significant-bit reference voltage ladder, and the bipolar offset resistor are all constructed of the same material.

7. The analog-to-digital converter defined in claim 6, wherein each resistor in said strings of series resistors in said most-significant-bit and said least-significant-bit reference voltage ladders has substantially equal value.

8. The analog-to-digital converter defined in claim 7, wherein the equivalent value of said least-significant-bit reference voltage ladder connected in series with said most-significant-bit reference voltage ladder is equal to the value of each resistor connected in series in said most-significant-bit reference voltage ladder.

9. The analog-to-digital converter defined in claim 8, wherein said most-significant-bit flash analog-to-digital converter consists of a 3-bit flash converter and said least-significant-bit flash analog-to-digital converter consists of a 4-bit flash converter, and wherein their digital outputs are combined to produce a 7-bit low-resolution output.

10. The analog-to-digital converter defined in claim 9, further comprising:
(k) a bias current compensation network in said low-resolution flash analog-to-digital converter consisting of a string of series resistors identical to those in said strings of series resistors in said most-significant-bit and said least-significant-bit reference voltage ladders, and connected to the string of comparators in said low-resolution flash analog-to-digital converter so that the impedance at both inputs of each comparator is exactly the same in order to cancel input bias current errors.

11. The analog-to-digital converter defined in claim 10, wherein all resistors in said bias current compensation network and all resistors of said strings of series resistors in said most-significant-bit and said least-significant-bit reference voltage ladders are substantially equal and constructed of the same material.

12. The analog-to-digital converter defined in claim 11, wherein said single string of current sources consists of bipolar transistor junctions driven by the same servo-circuit.

13. The analog-to-digital converter defined in claim 11, wherein said single string of current sources consists of junction field-effect transistors that are driven by the same servo-circuit.

14. The analog-to-digital converter defined in claim 11, wherein said single string of current sources consists of metal-oxide semiconductor field-effect transistors driven by the same servo-circuit.

15. The analog-to-digital converter defined in claim 11, wherein said single string of current sources consists of MOS transistors driven by the same servo-circuit.

16. The analog-to-digital converter defined in claim 11, wherein said at least two reference currents comprise the current through said reference voltage ladder of the low-resolution flash analog-to-digital converter and the bit currents for said reference digital-to-analog converter.

17. The analog-to-digital converter defined in claim 16, wherein said at least two reference currents further comprise the bit currents for said internal digital-to-analog converter and the bipolar offset current for the circuit.

18. A method of converting an analog signal into a high-resolution digital signal, comprising the following steps:
(a) passing an analog input signal through a low-resolution flash analog-to-digital converter for conversion into a first low-resolution digital signal corresponding to the upper significant bits of said high-resolution digital signal, wherein said low-resolution analog-to-digital converter comprises a reference voltage ladder consisting of a string of series resistors;

(b) passing said first low-resolution digital signal through a current-output reference digital-to-analog converter of resolution equal to that of said low-resolution analog-to-digital converter for reconverting said first low-resolution digital signal into a corresponding analog feedback signal;
(c) measuring the difference between said analog feedback signal and said analog input signal to determine an analog error signal;
(d) passing said analog error signal through said low-resolution flash analog-to-digital converter for conversion into a second low-resolution digital signal corresponding to the lower significant bits of said high-resolution digital signal;
(e) combining said first and second low-resolution digital signals into said high-resolution digital signal; and
(f) providing a single string of current sources to generate at least two of the currents in the set comprising: the current through said reference voltage ladder of the low-resolution flash analog-to-digital converter, the bit currents for said reference digital-to-analog converter, and the bipolar offset current for the circuit.

19. The method defined in claim 18, wherein each pass through said low-resolution flash analog-to-digital converter to process an analog signal corresponding first to said analog input signal and second to said analog error signal, consists of a two-step parallel subranging analog-to-digital conversion comprising the following additional steps:
(g) passing said analog signal to said low-resolution flash analog-to-digital converter through a most-significant-bit flash analog-to-digital converter for producing a first digital signal corresponding to the most significant bits of said analog signal;
(h) passing said first digital signal corresponding to the most significant bits of said analog signal through a current-output internal digital-to-analog converter of resolution equal to that of said most-significant-bit flash analog-to-digital converter for reconverting said first digital signal therefrom into a corresponding analog internal feedback signal;
(i) producing an internal analog residue signal measured by the difference between said analog signal to said most-significant-bit flash analog-to-digital converter and said analog internal feedback signal produced by said internal digital-to-analog converter;
(j) passing said internal analog residue signal through a least-significant-bit flash analog-to-digital converter for producing a second digital signal corresponding to the least significant bits of said analog signal; and
(k) providing additional current sources in said single string of current sources to also generate the bit currents for said internal digital-to-analog converter.

* * * * *